Figure 1:
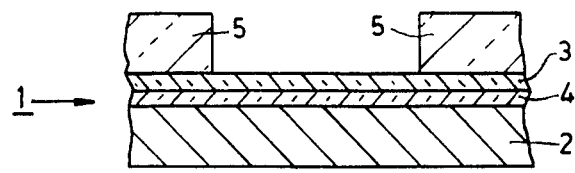

United States Patent [19]

Dieleman et al.

[11] Patent Number: 4,717,447

[45] Date of Patent: Jan. 5, 1988

[54] METHOD OF MANUFACTURING A SEMICONDUCTOR DEVICE BY MEANS OF PLASMA ETCHING

[75] Inventors: Jan Dieleman; Franciscus H. M. Sanders, both of Eindhoven, Netherlands

[73] Assignee: U.S. Philips Corporation, New York, N.Y.

[21] Appl. No.: 547,178

[22] Filed: Oct. 31, 1983

[30] Foreign Application Priority Data

Nov. 16, 1982 [NL] Netherlands .................... 8204437

[51] Int. Cl.$^4$ .................... B44C 1/22; C03C 15/00; C03C 25/06
[52] U.S. Cl. .................... 156/643; 156/646; 156/653; 156/657; 156/659.1; 204/192.37; 252/79.1
[58] Field of Search .................... 156/643, 646, 653, 657, 156/659.1, 345, 662; 204/192 E, 298; 427/38, 39; 252/79.1

[56] References Cited

U.S. PATENT DOCUMENTS

| | | | |
|---|---|---|---|
| 4,208,241 | 6/1980 | Harshbarger | 252/79.1 X |
| 4,226,665 | 10/1980 | Mogab | 156/662 X |
| 4,374,698 | 2/1983 | Sanders et al. | 156/643 |
| 4,450,042 | 5/1984 | Purdes | 156/643 |

Primary Examiner—William A. Powell
Attorney, Agent, or Firm—Paul R. Miller

[57] ABSTRACT

A method of manufacturing a semiconductor device in which a layer of silicon nitride overlying a silicon oxide layer present on a substrate is etched by bringing it into contact with substantially only uncharged constituents of a plasma formed in a reactor to which a substantially oxygen-free gas or gas mixture is supplied. According to the invention, 0.1 to 25% by volume of a halogen different from fluorine, or of a compound containing a halogen different from fluorine, is added to this gas or gas mixture containing fluorine or a fluorine compound. Thus, a high etching selectivity of silicon nitride with respect to silicon oxide is obtained which does not vary during etching.

4 Claims, 5 Drawing Figures

METHOD OF MANUFACTURING A SEMICONDUCTOR DEVICE BY MEANS OF PLASMA ETCHING

The invention relates to a method of manufacturing a semiconductor device, in which a layer of silicon nitride present on a substrate is etched by bringing the layer into contact with substantially only uncharged constituents of a plasma which is formed in a reactor to which a substantially oxygen-free gas or gas mixture is supplied comprising fluorine or a fluorine compound.

Such a method is particularly suitable for patterning a silicon nitride layer present on a silicon oxide layer by etching. The silicon nitride pattern thus obtained can be used as an oxidation mask or as an implantation mask. Damage of the silicon oxide layer then exposed during etching is avoided because substantially only uncharged constituents of the plasma are utilized, as is the case, for example, in conventional tunnel reactors.

The Dutch Patent Application No. 78,11,183 discloses a method of the kind mentioned in the preamble, in which the gas supplied to the reactor is silicon tetrafluoride. Silicon nitride is etched rapidly by the constituents of the plasma formed in this substantially oxygen-free gas, whereas silicon oxide is not attacked.

A disadvantage of the known described method is that in practice the high etching selectivity mentioned above—the ratio between the speeds at which silicon nitride and silicon oxide are etched—is not reached and that moreover the degree of this selectivity may vary during etching.

The invention has inter alia for its object to provide a method which renders it possible to etch silicon nitride layers with a high selectivity with respect to silicon oxide layers, where the etching selectivity substantially does not vary during etching. According to the invention, the method mentioned in the preamble is therefore characterised in that 0.1 to 25% by volume of a halogen different from fluorine or of a gasous compound containing a halogen different from fluorine is added to the gas or gas mixture supplied to the reactor.

The invention is based on the recognition of the fact that in practice the plasma always contains a small quantity of oxygen, by which the etching selectivity of silicon nitride with respect to silicon oxide is strongly influenced. As is also apparent from the Dutch Patent Application, this selectivity rapidly decreases when only a few percent by volume of oxygen are added to the gas in which the plasma is formed. Through small leaks, air can penetrate into the reactor operated at a sub-atmospheric pressure. Furthermore, reactor parts can evolve oxygen during operation.

The oxygen, which is unintentionally present in the reactor, is converted in the plasma into activated oxygen, and as a result silicon nitride is converted at least in part into silicon oxide. This conversion proceeds during etching. It is also probable that activated oxygen gives rise to higher speeds of etching silicon oxide. This may result in that the etching selectivity of silicon nitride with respect to silicon oxide is comparatively low and decreases during etching. It is presumed, however, that in a method according to the invention, the activated atomic oxygen, before reaching the substrate, reacts with the halogen different from fluorine present in the plasma and is then converted into considerably less active molecular oxygen. As a result, the disadvantageous effects would be suppressed, which in practice has proven to be the case.

The method according to the invention is preferably characterised in that bromine or a bromine compound is added to the gas or gas mixture supplied to the reactor.

Due to this addition, a high etching selectivity of silicon nitride with respect to silicon oxide is obtained which does not vary substantially during etching.

Silicon nitride is etched only very selectively with respect to silicon oxide but also very rapidly if the gas or gas mixture supplied to the reactor comprises $NF_3$.

Figure 2:
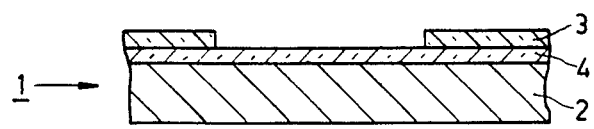
Figure 3:
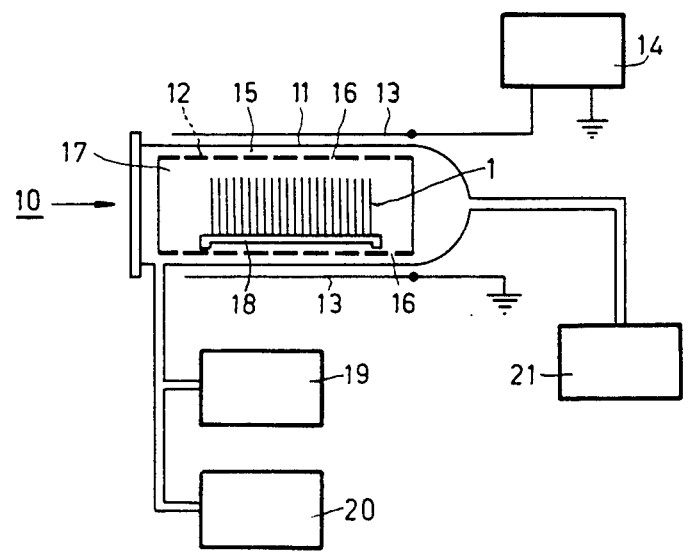
Figure 4:
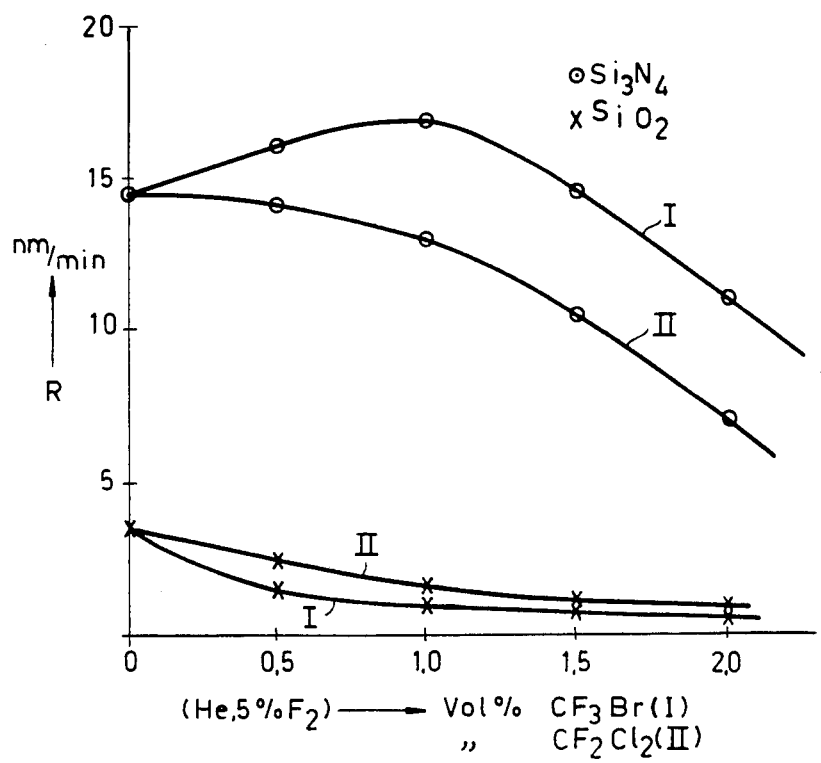
Figure 5:
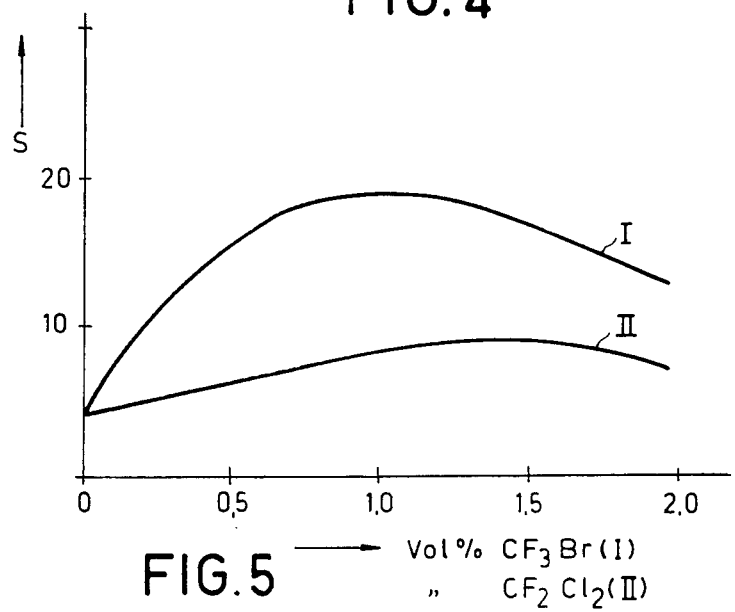

The invention will now be described more fully by way of example with reference to the drawings and with reference to a few examples. In the drawings:

FIGS. 1 and 2 show different stages of the manufacture of a semiconductor device by means of the method according to the invention, FIG. 3 shows diagrammatically a device for carrying out the method according to the invention, and FIGS. 4 and 5 represent speeds at which the silicon nitride and silicon oxide layers are etched and the selectivities with which these layers are etched with respect to each other, respectively, as a function of the quantity of the gaseous compound which contains a halogen different from fluorine and which is added to a fluorine-containing gas supplied to the reactor.

FIGS. 1 and 2 show different stages of the manufacture of a semiconductor device by means of a method in which a layer of silicon nitride 3 present on a substrate 2 is etched. The silicon nitride layer 3 is separated in this embodiment from the substrate 2 by a layer of silicon oxide 4. In a conventional manner, a mask 5 of, for example, photolacquer is provided on the silicon nitride layer 3, after which the then uncovered part of the silicon nitride layer 3 is etched away. The silicon nitride pattern thus obtained can then be used as an oxidation mask or as an implanation mask.

The silicon nitride layer 3 is etched by bringing it into contact with substantially only uncharged constituents of a plasma which is formed in the reactor 10 shown in FIG. 3. The reactor 10 comprises a reactor vessel 11 of quartz glass within which is arranged an aluminium tunnel 12. In the reactor 10, a plasma is produced in the space 15 located between the reactor vessel 11 and the tunnel 12 by means of an electrode system 13 and a high-frequency transmitter 14. The tunnel 12 is provided with openings 16 through which substantially only uncharged constituents of the plasma can penetrate into the space 17 within the tunnel 12. In the space 17, a number of substrates 1 are arranged on a holder 18.

A substantially oxygen-free gas or gas mixture containing fluorine or a fluorine compound is supplied to the reactor 10 from a container 19. According to the invention, 0.1 to 25% by volume of a halogen different from fluorine or of a gaseous compound containing a halogen different from fluorine is added thereto from a container 20. By means of a pump 21, the space within the reactor 10 is kept at a low pressure.

By means of the method according to the invention, as will appear from the following examples, silicon nitride can be etched with a high selectivity with respect to silicon oxide, the etching selectivity not varying substantially during etching. It is presumed that activated oxygen which is formed in the plasma from oxygen which may have penetrated through leaks and is evolved by reactor parts before reaching the substrates 1, reacts with the added halogen and is converted into less active molecular oxygen. The etching selectivity would be adversely affected by activated oxygen.

Preferably, bromine or a bromine compound is added to a gas or gas mixture supplied to the reactor. As will appear from the following examples, a high etching selectivity of silicon nitride with respect to silicon oxide can be obtained, which does not vary substantially during etching. A particularly suitable bromine compound is $CF_3Br$.

In the examples to be described hereinafter, silicon wafers 2 having a diameter of approximately 75 mm and coated with a silicon oxide layer 4 which is approximately 20 nm thickness and with an approximately 125 nm thick were etched in a plasma produced in a reactor of the type described hereinbefore. The plasma was produced with the aid of a high-frequency field at a frequency of 13.56 MHz.

EXAMPLE 1

FIG. 4 represents speeds R at which silicon nitride and silicon oxide are etched and FIG. 5 shows the ratio of these speeds (the etching selectivity S) as a function of the quantity of a gaseous compound which contains a halogen different from fluorine and which is added to the gas supplied to the reactor. In this example, the gaseous compound is $CF_3Br$ or $CF_2Cl_2$. This compound is added to a mixture of helium and fluorine which contains fluorine in a quantity of approximately 5% by volume. The gas stream invariably amounts to approximately 200 scc/min, and the high-frequency power supplied is approximately 150 W. The temperature of the substrates is approximately 100° C. and the pressure in the reactor vessel is approximately 200 PA.

By addition of $CF_3Br$ or $CF_2Cl_2$, it is achieved that the etching selectivity increases. It further appears from the following Table that this selectivity does not vary during etching; this is in contrast with the case in which no additional halogen is added.

TABLE

| | Selectivity $Si_3N_4/SiO_2$ | | |
|---|---|---|---|
| | 1% by vol. $CF_3Br$ | 1,5% by vol. $CF_2Cl_2$ | no addition |
| after 1 min. | 19 | 9,5 | 4 |
| after 3 min. | 19 | 9,5 | 3 |
| after 7 min. | 19 | 9,5 | 3 |

It appears that a particularly favourable etching selectivity which does not vary during etching is obtained if the gas mixture supplied to the reactor consists of helium and 2 to 10% by volume of fluorine, to which 0.5 to 2% by volume of $CF_3Br$ are added.

Instead of helium, other rare gases or nitrogen may be used, although in these cases plasmas are produced which are slightly less uniform.

EXAMPLE 2

In this example, the gas or gas mixture supplied to the reactor comprises $NF_3$. The gas stream in this example amounts to 5 sec/min, the pressure is approximately (25 Pa), the electrical power supplied is 100 W and the substrate temperature is approximately 100° C. Without addition of additional halogen, the etching selectivity of silicon nitride with respect to silicon oxide is approximately 8. When 5% by volume of $CF_2CL_2$ is added to the gas supplied to the reactor, this selectivity becomes approximately 10, while it becomes approximately 12 by the addition of 10% by volume of $CF_3Br$. The use of $NF_3$ has the particular advantage that silicon nitride can be etched rapidly; and under the given etching conditions, this etching speed is approximately 80 nm/min. By the addition of other gases—rare gases, nitrogen, slowly etching gases, such as $CF_4$—, this speed can be reduced, if desired for practical uses, while maintaining the high etching selectivity.

EXAMPLE 3

In this example, the gas or gas mixture supplied to the reactor consisted of $CF_4$, to which 5% by volume of $Br_2$ is added as a halogen different from fluorine. The gas stream is in this example 200 sec/min, the pressure is (67 Pa) and the electrical power supplied is 500 Watts. Under these conditions, silicon nitride is etched at a speed of approximately 20 nm/min. The etching selectivity with respect to silicon oxide is higher than 100, whereas this selectivity is approximately 5 without the addition of the additional halogen.

EXAMPLE 4

In this example, the gas or gas mixture supplied to the reactor consists of $SF_6$. As the additional halogen compound, 5% by volume of $CF_3Br$ were added thereto. The gas stream is 100 sec/min, the pressure is (67 Pa), the electrical power supplied is 200 Watts and the substrate temperature is 125° C. Silicon nitride is etched under these conditions at a speed of 5 nm/min. The etching selectivity with respect to silicon oxide is higher than 10, whereas this selectivity is approximately 4 without the addition of additional halogen.

It should be appreciated that the invention is not limited to the examples given, but that modifications are possible without departing from the scope of the invention. For example, a halogen different from fluorine or a halogen compound containing a halogen different from fluorine may also be added to the gas supplied to the reactor by introducing into the reactor a substance slowly evaporating at a low pressure, such as, for example, a bromine-containing polymer.

What is claimed is:
1. A method of manufacturing a semiconductor device comprising the steps of
    forming a plasma in a reactor, said plasma including fluorine or a fluorine compound, and said plasma being substantially oxygen-free,
    adding 0.1 to 25% by volume of a halogen different from fluorine to said plasma, wherein said halogen different from fluorine is a bromine or bromine compound, and wherein said bromine compound is $CF_3Br$, and
    etching a layer of silicon nitride on a substrate with said plasma, wherein said plasma includes helium and 2 to 10% by volume of fluorine to which 0.5 to 2% by volume of said $CF_3BR$ is added.
2. A method of manufacturing a semiconductor device comprising the steps of
    forming a plasma in a reactor, said plasma including fluorine or a fluorine compound, and said plasma being substantially oxygen-free,
    adding 0.1 to 25% by volume of a halogen different from fluorine to said plasma, wherein said halogen different from fluorine is a bromine or a bromine compound, and wherein said bromine compound is $CF_3Br$, and
    etching a layer of silicon nitride on a substrate with said plasma, wherein said plasma includes $NF_3$.

3. A method of manufacturing a semiconductor device comprising the steps of
   forming a plasma in a reactor, said plasma including fluorine or a fluorine compound, and said plasma being substantially oxygen-free,
   adding 0.1 to 25% by volume of a halogen different from fluorine to said plasma, and
   etching a layer of silicon nitride on a substrate with said plasma, wherein said plasma includes helium and 2 to 10% by volume of fluorine to which 0.5 to 2% by volume of $CF_3Br$ is added.

4. A method of manufacturing a semiconductor device comprising the steps of
   forming a plasma in a reactor, said plasma including fluorine or a fluorine compound, and said plasma being substantially oxygen-free,
   adding 0.1 to 25% by volume of a halogen different from fluorine to said plasma, and
   etching a layer of silicon nitride on a substrate with said plasma, wherein said plasma includes $NF_3$.

* * * * *